US009064952B2

(12) United States Patent
Takaya

(10) Patent No.: US 9,064,952 B2
(45) Date of Patent: Jun. 23, 2015

(54) SEMICONDUCTOR DEVICE

(75) Inventor: Hidefumi Takaya, Miyoshi (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 1085 days.

(21) Appl. No.: 13/042,499

(22) Filed: Mar. 8, 2011

(65) Prior Publication Data

US 2011/0220991 A1    Sep. 15, 2011

(30) Foreign Application Priority Data

Mar. 9, 2010    (JP) ................................ 2010-51794

(51) Int. Cl.
  *H01L 29/66*  (2006.01)
  *H01L 29/78*  (2006.01)
  *H01L 29/06*  (2006.01)
  *H01L 29/10*  (2006.01)

(52) U.S. Cl.
  CPC ........ *H01L 29/7813* (2013.01); *H01L 29/0623* (2013.01); *H01L 29/0653* (2013.01); *H01L 29/0661* (2013.01); *H01L 29/1095* (2013.01); *H01L 29/7811* (2013.01)

(58) Field of Classification Search
  CPC ............ H01L 29/7813; H01L 29/7811; H01L 29/66734; H01L 29/4236; H01L 29/7827; H01L 29/66348; H01L 29/7397; H01L 29/66666; H01L 21/823487; H01L 29/66712; H01L 21/76224; H01L 29/8083
  USPC .................... 257/330, 332, E27.26, E21.429, 257/E29.257, E21.334; 438/270, 272; 1/330, 332, E27.26, E21.429, E29.257, 1/E21.334
  See application file for complete search history.

(56) References Cited

U.S. PATENT DOCUMENTS

| 6,011,298 A | 1/2000 | Blanchard |
| 8,076,718 B2 | 12/2011 | Takaya et al. |
| 2008/0087951 A1* | 4/2008 | Takaya et al. ................. 257/334 |
| 2011/0233667 A1* | 9/2011 | Tai et al. ....................... 257/334 |

FOREIGN PATENT DOCUMENTS

| EP | 0813250 A2 | 12/1997 |
| JP | 10070271 A | 3/1998 |
| JP | 10-209451 A | 8/1998 |
| JP | 10209451 A | 8/1998 |
| JP | 11-087698 A | 3/1999 |
| JP | 2001015744 A | 1/2001 |
| JP | 2006-128507 A | 5/2006 |

OTHER PUBLICATIONS

Office Action dated Feb. 21, 2012 in Japanese Patent Application No. 2010-051794 and English language translation thereof.

* cited by examiner

Primary Examiner — Meiya Li
(74) Attorney, Agent, or Firm — Gifford, Krass, Sprinkle, Anderson & Citkowski, P.C.

(57) ABSTRACT

A semiconductor device 10 includes an element domain 40 and a termination domain 50 that surrounds the element domain 40. The element domain 40 and the termination domain 50 respectively include a second conductive type drift region 18. A gate trench 38 may be provided in the element domain 40. The termination domain 50 may be provided with a termination trench 22 surrounding the element domain. A first conductive type floating region surrounded by the drift region 18 is not provided at a bottom of the gate trench 38, and a first conductive type floating region 20 surrounded by the drift region 18 is provided at a bottom of the termination trench 22.

9 Claims, 4 Drawing Sheets

SEMICONDUCTOR DEVICE

CROSS-REFERENCE TO RELATED APPLICATION

This application claims priority to Japanese Patent Application No. 2010-51794 filed on Mar. 9, 2010, the contents of which are hereby incorporated by reference into the present application.

TECHNICAL FIELD

The present application relates to a technique for increasing breakdown voltage of a semiconductor device.

DESCRIPTION OF RELATED ART

A semiconductor device provided with an element domain and a termination domain that surrounds the element domain is known. In a semiconductor device of this type, typically, a device structure (e.g., a MOS (Metal Oxide Semiconductor) or an IGBT (Insulated Gate Bipolar Transistor)) is formed in the element domain and a structure for increasing breakdown voltage (hereinafter referred to as a "breakdown voltage structure") is formed in the termination domain. For example, an FLR (Field Limiting Ring) structure is well known as the breakdown voltage structure. The FLR structure enables a depletion layer extending from the element domain to spread to outside of the FLR. Consequently, electric field concentration is mitigated and a breakdown voltage characteristic of the semiconductor device is improved. Japanese Patent Application Publication No. 2001-15744 discloses an example of a conventional technique for increasing the breakdown voltage of a semiconductor device.

BRIEF SUMMARY OF INVENTION

In the conventional technique, the breakdown voltage is increased by spreading the depletion layer extending from the element domain in a lateral direction (in other words, a direction parallel to an upper surface of a semiconductor substrate) as is the case with the FLR structure described above. Therefore, in order to increase the breakdown voltage, the termination domain must be spread laterally to secure space for the depletion layer to expand. As a result, there is a problem in that a space in the termination domain where a device structure is not formed must be enlarged.

It is an object of the present teachings to provide a novel breakdown voltage structure which enables a space of a termination domain to be reduced compared to the conventional breakdown voltage structures, while increasing breakdown voltage.

In one aspect of the present teachings, a semiconductor device comprises a semiconductor substrate, a first main electrode, and a second main electrode. The semiconductor substrate includes an element domain and a termination domain that surrounds the element domain. The first main electrode is disposed on an upper surface of the semiconductor substrate, and the second main electrode is disposed on a lower surface of the semiconductor substrate. The element domain comprises a first body region, a first drift region, a gate electrode, and an insulator. The first body region exposed at the upper surface of the semiconductor substrate is a first conductive type region and connected to the first main electrode. The first drift region is a second conductive type region and makes contact with a lower surface of the first body region. The gate electrode is disposed within a gate trench penetrating the first body region and extending to the first drift region, and faces the first body region. The insulator is disposed between the gate electrode and a wall of the gate trench. The termination domain comprises at least a second drift region that is a second conductive type region. The termination domain is provided with a termination trench surrounding the element domain. A first conductive type floating region surrounded by the first drift region is not provided at a bottom of the gate trench. A first conductive type floating region surrounded by the second drift region is provided at the bottom of the termination trench.

The "first conductive type" and the "second conductive type" refer to either an n-type or a p-type. In other words, if the "first conductive type" is the p-type, the "second conductive type" is the n-type, and if the "first conductive type" is the n-type, the "second conductive type" is the p-type.

In the above semiconductor device, the first conductive type floating region is not provided at the bottom of the gate trench while the first conductive type floating region is provided at the bottom of the termination trench. In other words, the first conductive type floating region is only formed in the termination domain. As a result, due to the floating region in the termination domain, a depletion layer extending from a P-N junction of the first drift region and the first body region when the semiconductor device is turned off spreads in a depth direction of the semiconductor substrate in the termination domain. Since the depletion layer spreads in the termination domain due to the floating region, the breakdown voltage of the semiconductor device can be increased. In addition, since the depletion layer spreads in the depth direction of the semiconductor substrate in the termination domain, the termination domain need not be laterally expanded. Therefore, the space of the termination domain can be reduced.

These aspects and features may be utilized singularly or, in combination, in order to make improved semiconductor devices. In addition, other objects, features and advantages of the present teachings will be readily understood after reading the following detailed description together with the accompanying drawings and claims. Of course, the additional features and aspects disclosed herein also may be utilized singularly or, in combination with the above-described aspect and features.

DETAILED DESCRIPTION OF INVENTION

First Embodiment

Figure 1:
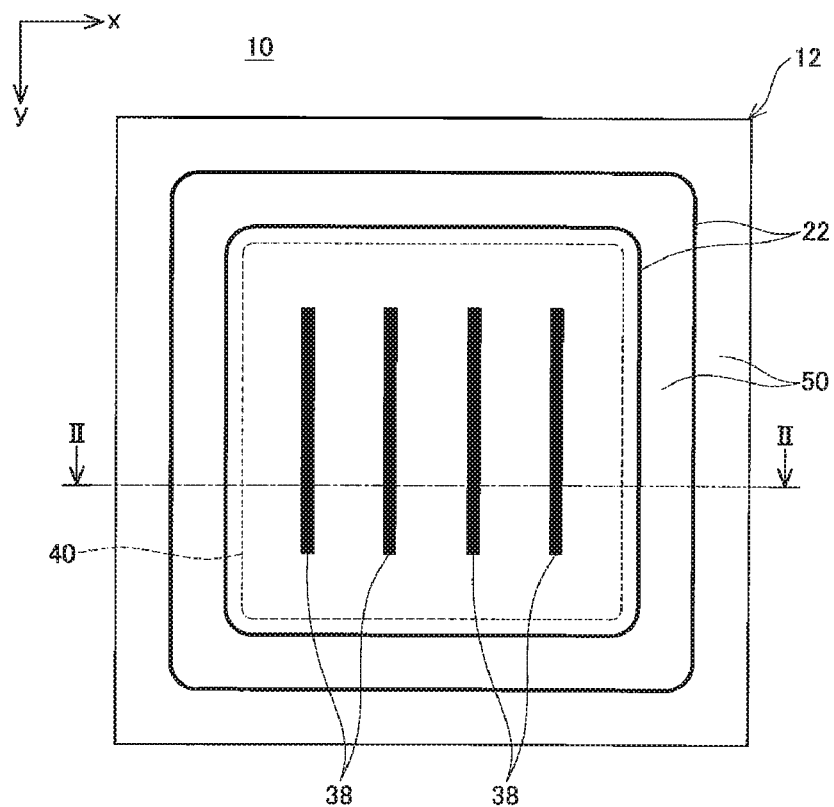
FIG. 1 is a plan view of a semiconductor device according to a first embodiment, in which electrodes formed on an upper surface of a semiconductor substrate are not shown.

A semiconductor device 10 according to the first embodiment will now be described with reference to the drawings. As shown in FIG. 1, the semiconductor device 10 comprises an element domain 40 and a termination domain 50 that surrounds the element domain 40.

A plurality of gate trenches 38 is formed in the element domain 40. The gate trenches 38 extend in a y-direction in FIG. 1 and are arranged at regular intervals in an x-direction in FIG. 1. Termination trenches 22 are formed in the termination domain 50. Each of the termination trenches 22 surrounds the element domain 40. The element domain 40 and the termination domain 50 are formed on a same semiconductor substrate 12. A known substrate (e.g., a silicon substrate (Si substrate), a silicon carbide substrate (SiC substrate), and the like) can be used as the semiconductor substrate 12.

Figure 2:
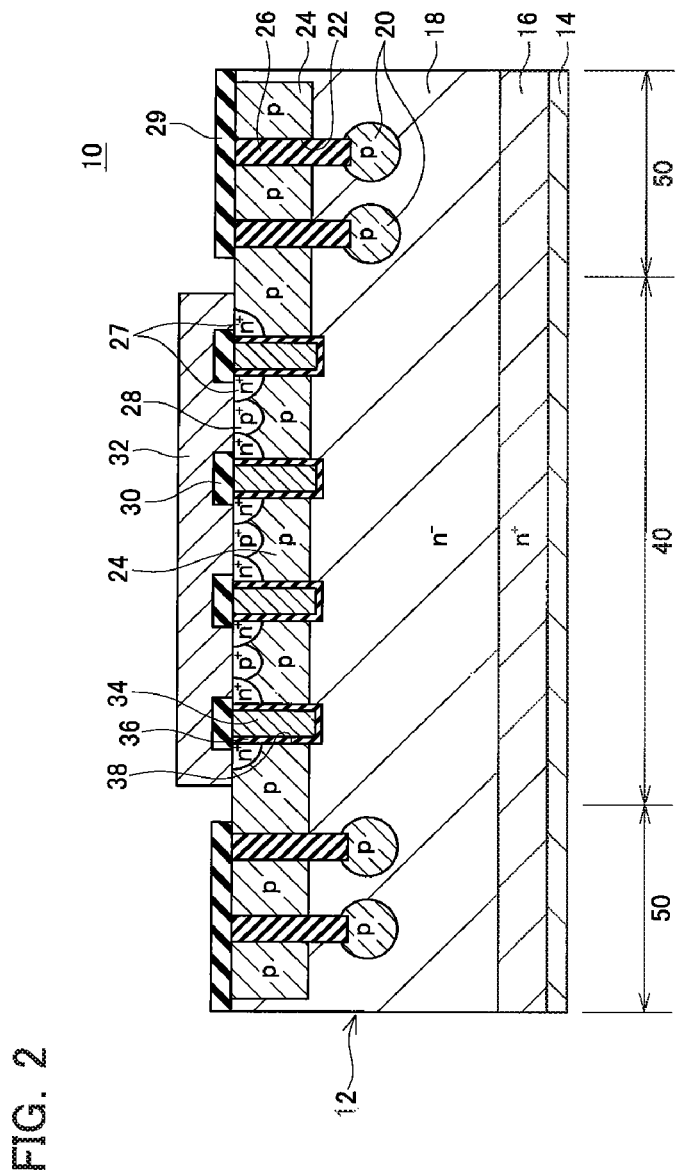
FIG. 2 is a cross-sectional view taken along II-II in FIG. 1.

First, a configuration of the element domain 40 will be described. As shown in FIG. 2, a vertical field effect transistor (MOSFET) is formed in the element domain 40. Specifically, in the element domain 40, the gate trench 38 is formed on an upper surface of the semiconductor substrate 12. In this embodiment, although a plurality of gate trenches 38 is formed, the present teachings may be configured to include only one gate trench 38. Hereinbelow, explanation will be given by focusing on one gate trench 38. The gate trench 38 penetrates a source region 27 and a body region 24, and a lower end of the gate trench 38 extends to a drift region 18. The lower end of the gate trench 38 is set slightly deeper than a boundary between the body region 24 and the drift region 18. A gate electrode 34 is formed in the gate trench 38. The gate electrode 34 is formed such that a lower end thereof is slightly deeper than a lower surface of the body region 24. An insulator 36 fills a gap between a wall surface of the gate trench 38 and the gate electrode 34 (in other words, to the side and under the gate electrode 34). Therefore, the gate electrode 34 faces the body region 24 and the source region 27 via the insulator 36. Moreover, an insulation film 30 is formed at an upper part of the gate electrode 34.

In addition, in the element domain 40, an n+ type source region 27 and a p+ type body contact region 28 are formed in a region exposed at the upper surface of the semiconductor substrate 12. The source region 27 is formed so as to come into contact with the insulator 36. The body contact region 28 is formed so as to come into contact with the source region 27.

A p− type body region 24 is formed under the source region 27 and the body contact region 28. An impurity concentration of the body region 24 is set lower than an impurity concentration of the body contact region 28. The body region 24 is in contact with the source region 27 and the body contact region 28, and is in contact with the insulator 36 below the source region 27. Therefore, the source region 27 is surrounded by the body region 24 and the body contact region 28. Moreover, the body region 24 is formed so as to extend laterally into the termination domain 50.

An n− type drift region 18 is formed under the body region 24. The drift region 18 is formed in the element domain 40 and the termination domain 50. The drift region 18 is in contact with a lower surface of the body region 24. The drift region 18 is separated from the source region 27 by the body region 24.

An n+ type drain region 16 is formed in a region exposed at a lower surface of the semiconductor substrate 12. The drain region 16 is formed in the element domain 40 and the termination domain 50. An impurity concentration of the drain region 16 is set higher than an impurity concentration in the drift region 18. The drain region 16 is in contact with a lower surface of the drift region 18. The drain region 16 is separated from the body region 24 by the drift region 18.

A drain electrode 14 is formed on the lower surface of the semiconductor substrate 12. The drain electrode 14 is formed over the entire lower surface of the semiconductor substrate 12. The drain electrode 14 is in ohmic contact with the drain region 16. A source electrode 32 is formed on an upper surface of the element domain 40 of the semiconductor substrate 12. The source electrode 32 is formed so as to cover the insulation film 30 and is insulated from the gate electrode 34. The source electrode 32 is in ohmic contact with the source region 27 and the body contact region 28.

Next, the termination domain 50 will be described. As shown in FIG. 2, in the termination domain 50, the drain region 16, the drift region 18, and the body region 24 are laminated in sequence from the side of the lower surface of the semiconductor substrate 12. However, the body region 24 is not exposed at a side surface of the semiconductor substrate 12 but the drift region 18 is exposed at a side surface of the semiconductor substrate 12. Specifically, in the termination domain 50, the drift region 18 is formed outside of the body region 24. By not having the body region 24 exposed at a side surface of the semiconductor substrate 12, leakage current is suppressed.

Two termination trenches 22 are formed in the termination domain 50. In this embodiment, although a plurality of termination trenches 22 is formed, hereinbelow, explanation will be given by focusing on one termination trench 22. The termination trench 22 penetrates the body region 24 and a lower end of the termination trench 22 extends to the drift region 18. The lower end of the termination trench 22 is positioned deeper than the lower end of the gate trench 38. The inside of the termination trench 22 is filled with the insulator 26. A p− type diffusion region 20 is formed at a bottom of the termination trench 22. The diffusion region 20 is surrounded by the drift region 18. The diffusion region 20 is separated from the body region 24 by the drift region 18 and a potential of the diffusion region 20 is set to a floating state.

Moreover, in the termination domain 50, a contact region is not formed on the upper surface of the semiconductor substrate 12 and an insulation film 29 is formed on the upper surface of the semiconductor substrate 12. Therefore, the body region 24 on an outer side of the inner termination trench 22 is not electrically connected to any of the electrodes and a potential of the body region 24 is set to a floating state.

Operations of the semiconductor device 10 will be described. When an on-potential (i.e., a potential equal to or greater than a potential necessary for forming a channel) is applied to the gate electrode 34 in a state where the drain electrode 14 is connected to a power supply potential and the source electrode 32 is connected to a ground potential, the semiconductor device 10 turns on. In other words, by applying the on-potential to the gate electrode 34, a channel is formed in the body region 24 in a range where the body region 24 is in contact with the insulator 36. Accordingly, electrons flow to the drain electrode 14 from the source electrode 32 through the source region 27, the channel of the body region 24, the drift region 18, and the drain region 16. In other words, a current flows from the drain electrode 14 to the source electrode 32.

Figure 3:
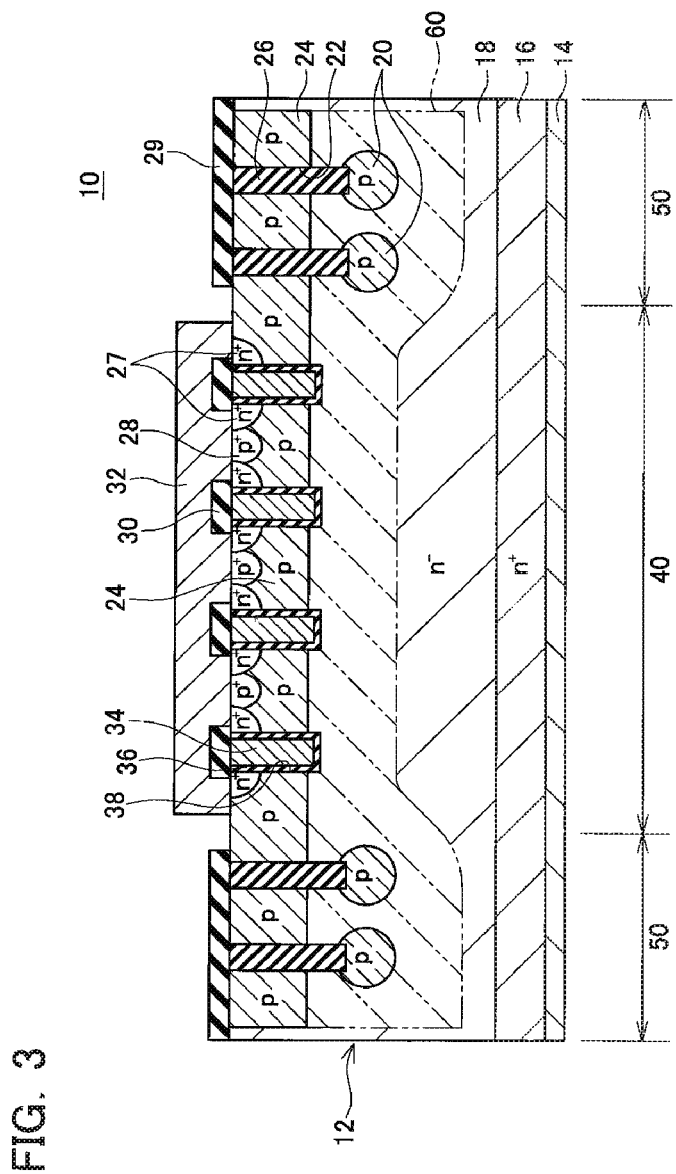
FIG. 3 is a diagram illustrating a state where a depletion layer has spread when the semiconductor device according to the first embodiment is turned off.

When the potential applied to the gate electrode 34 is switched from the on-potential to an off-potential, the semiconductor device 10 turns off. When the semiconductor device 10 turns off, a depletion layer spreads from a P-N junction of the body region 24 and the drift region 18 of the element domain 40. In the termination domain 50, the diffusion region 20 is formed at a deeper position than the lower surface of the body region 24. Therefore, as shown in FIG. 3, a depletion layer 60 spreading from the element domain 40 spreads in a depth direction of the semiconductor substrate 12 due to the diffusion region 20. Moreover, in FIG. 3, a region hatched by dashed two-dotted lines indicates a state of maximum spread of the depletion layer 60. With the semiconductor device 10 according to the present embodiment, the breakdown voltage of the semiconductor device 10 is increased by having the depletion layer 60 spread in the depth direction of the semiconductor substrate 12 in the termination domain 50.

Moreover, the depth of the termination trench 22 and a size and impurity concentration of the diffusion region 20 are set so that the depletion layer that spreads from the P-N junction of the body region 24 and the drift region 18 of the element domain 40 reaches the diffusion region 20 before the semiconductor device 10 breaks down. Accordingly, in the termination domain 50, the depletion layer can be spread in the depth direction of the semiconductor substrate 12 and the breakdown voltage of the semiconductor device 10 can be increased.

The diffusion region 20 described above can suitably be formed by, for example, a method described below. That is, an oxide film is formed over the entire upper surface of the semiconductor substrate 12 and an opening corresponding to the termination trench 22 is formed on the oxide film. Next, using the oxide film on which the opening has been formed as a mask, the semiconductor substrate 12 is etched in order to form the termination trench 22. Once the termination trench 22 is formed, p-type impurity ions are injected from the upper side of the semiconductor substrate 12 towards the bottom of the termination trench 22 and the injected impurity ions are thermally diffused. Accordingly, the diffusion region 20 can be formed at the bottom of the termination trench 22. After forming the diffusion region 20, the inside of the termination trench 22 is filled by the insulator 26 by a chemical vapor deposition (CVD) method or the like. Subsequently, the gate trench 38, the gate electrode 34, and the like may be formed using a conventionally known method. With the method described above, since the impurity ions are injected to the bottom surface of the termination trench 22, the impurity ions can be injected with low implantation energy. In addition, since the impurity ions need not be injected deeply, the diffusion region 20 can be accurately formed.

Moreover, when manufacturing the semiconductor device 10, a manufacturing process can be simplified by simultaneously forming a plurality of regions. For example, the body region 24 of the element domain 40 and the diffusion region 20 of the termination domain 50 may be formed in a same ion injection process. Furthermore, by performing etching in a state where a thick oxide film is formed at a position corresponding to the gate trench 38 and a thin oxide film is formed at a position corresponding to the termination trench 22, the gate trench 38 and the termination trench 22 can be formed in a same etching process.

As described above, in the semiconductor device 10 according to the first embodiment, the diffusion region 20 is formed at the bottom of the termination trench 22 that is formed deeper than the gate trench 38. Therefore, when the semiconductor device 10 is turned off, the depletion layer extending from the P-N junction of the drift region 18 and the body region 24 spreads in the depth direction of the semiconductor substrate 12 in the termination domain 50 due to the diffusion region 20. Since a wide depletion layer is formed by the diffusion region 20, the breakdown voltage of the semiconductor device 10 can be increased. In addition, since the depletion layer spreads in the depth direction of the semiconductor substrate 12, the termination domain 50 need not be laterally expanded. Therefore, the space of the termination domain 50 can be reduced.

Furthermore, while the diffusion region 20 is formed at a deep position from the upper surface of the semiconductor substrate 12 in the semiconductor device 10 according to the first embodiment described above, the diffusion region 20 can be formed by injecting the impurity ions at the bottom of the termination trench 22. Therefore, the impurity ions can be injected with low energy to form the diffusion region 20. Consequently, even if a SiC substrate is used as the semiconductor substrate 12, the diffusion region 20 can be formed at a deep position from the upper surface of the semiconductor substrate 12. In other words, although it is difficult to deeply inject the impurity ions with the SiC substrate, the impurity ions may be injected at the bottom of the termination trench 22 in the semiconductor device 10 according to the first embodiment. Therefore, the impurity ions need not be injected deeply and the diffusion region 20 can be formed at a position deeper than the upper surface of the semiconductor substrate 12 even when using a SiC substrate as the semiconductor substrate 12.

Moreover, in the semiconductor device 10 according to the first embodiment described above, since the diffusion region 20 can be formed by injecting the impurity ions at the bottom of the termination trench 22, the diffusion region 20 can be accurately formed. As a result, fine patterns can also be accommodated.

Second Embodiment

Figure 4:
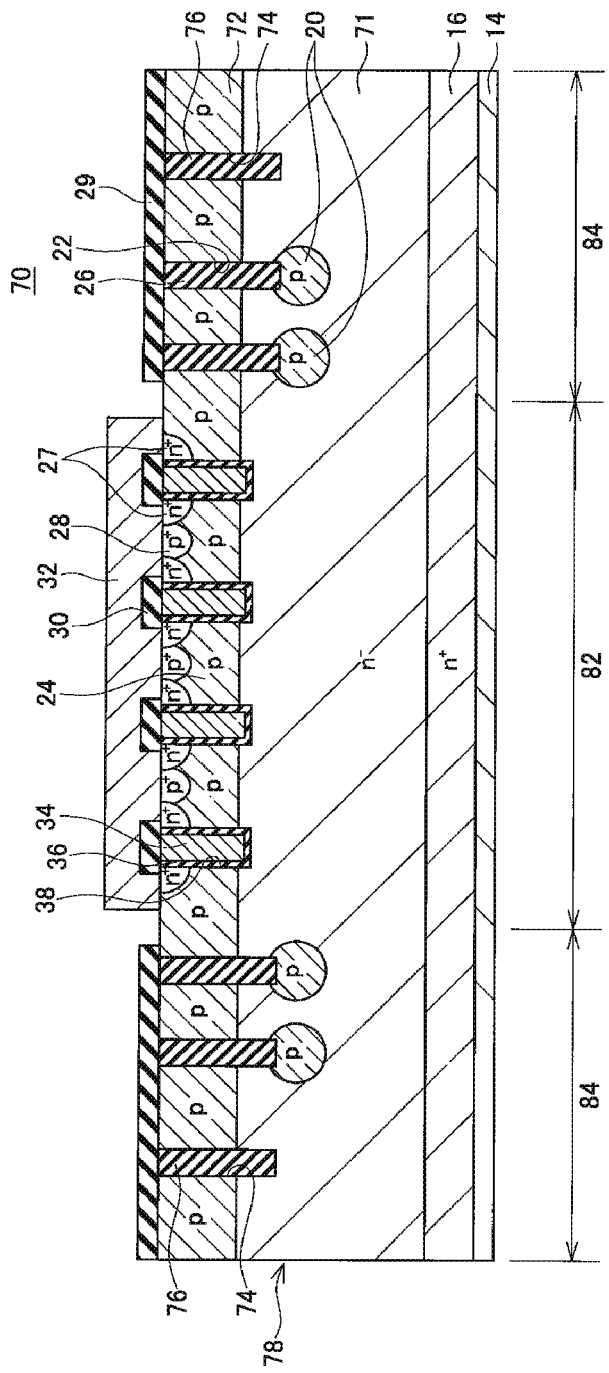
FIG. 4 is a cross-sectional view of a semiconductor device according to a second embodiment.

A semiconductor device 70 according to a second embodiment will now be described with reference to FIG. 4. The semiconductor device 70 according to the second embodiment differs from the semiconductor device 10 according to the first embodiment in that a body region 72 is formed so as to extend laterally to a side surface of a semiconductor substrate 78 and that a termination trench 74 is further provided. Other components of the semiconductor device 70 according to the second embodiment are similar to those of the first embodiment. Therefore, similar portions to the semiconductor device 10 according to the first embodiment will be denoted by same reference numerals and a description thereof will be omitted.

In the semiconductor substrate 78 used in the semiconductor device 70 according to the second embodiment, the body region 72 is laminated over an entire upper surface of a drift region 71. Therefore, the body region 72 is exposed at the side surface of the semiconductor substrate 78. In addition, two termination trenches 22 with diffusion regions 20 formed at bottoms thereof and the termination trench 74 disposed on an outer side of the termination trenches 22 are formed in a termination domain 84. A diffusion region 20 is not formed at a bottom of the termination trench 74 and an inside of the termination trench 74 is filled with an insulator 76. By filling the inside of the termination trench 74 with the insulator 76, the body region 72 on an inner side of the termination trench 74 and the body region 72 on an outer side of the termination trench 74 are separated from each other. Furthermore, an interval between the outside termination trench 22 and the termination trench 74 is set longer than the interval between the two termination trenches 22. Accordingly, when the semiconductor device 70 is turned off, a depletion layer spreading from a P-N junction of the body region 72 and the drift region 71 of an element domain 82 is prevented from spreading to the outer side of the termination trench 74.

Even with the semiconductor device 70 according to the second embodiment, since the diffusion region 20 is formed at the bottom of the termination trench 22, the depletion layer spreads in a depth direction of the semiconductor substrate 78 in the termination domain 84 when the semiconductor device 70 is turned off. Accordingly, the breakdown voltage of the semiconductor device 70 is increased. In addition, although the body region 72 is formed to a range where the body region 72 is exposed at the side surface of the semiconductor substrate 78, the depletion layer spread in the termination domain 84 is prevented from reaching the outer side of the termination trench 74. Accordingly, leakage current is prevented.

Moreover, the breakdown voltage structure of the termination domain 84 according to the second embodiment is effective in a semiconductor device using the SiC substrate as the semiconductor substrate 78. Specifically, in a general semiconductor device using the SiC substrate, since a body region is formed on an upper surface of a drift region by epitaxial growth, the body region is formed over an entire upper surface of the drift region. Therefore, by employing the breakdown voltage structure according to the second embodiment to the semiconductor device using the SiC substrate, the breakdown voltage of the semiconductor device can be increased and the termination domain can be made more compact.

While the respective embodiments described above present mere examples where two termination trenches 22 having diffusion regions 20 formed at bottoms thereof are formed in the termination domain, the present teachings are not limited to such an example. The number and depth of a termination trench in which the diffusion region 20 is formed can be determined as appropriate depending on breakdown voltage required for a semiconductor device. In addition, a plurality of termination trenches with different depths may be formed and diffusion regions may be formed at bottoms of the termination trenches. Accordingly, the depletion layer can be formed in a desired shape. For example, by forming a termination trench that gradually becomes deeper from a side of an element domain, the depletion layer may be formed so as to gradually become deeper from the side of the element domain.

Furthermore, while the respective embodiments described above present an example where a MOSFET is formed on a semiconductor substrate, other semiconductor devices (such as an IGBT) can be formed on the semiconductor substrate instead. Moreover, while the respective embodiments described above present an example of a semiconductor device in which the first conductive type is the p-type and the second conductive type is the n-type, the present teachings can also be applied to a semiconductor device in which the first conductive type is the n-type and the second conductive type is the p-type.

The preferred embodiments of the present teachings have been described above, the explanation was given using, as an example, the present teachings is not limited to this type of configuration.

Finally, although the preferred representative embodiments have been described in detail, the present embodiments are for illustrative purpose only and not restrictive. It is to be understood that various changes and modifications may be made without departing from the spirit or scope of the appended claims. In addition, the additional features and aspects disclosed herein also may be utilized singularly or in combination with the above aspects and features.

What is claimed is:

1. A semiconductor device comprising:
    a semiconductor substrate including an element domain and a termination domain that surrounds the element domain;
    a first main electrode disposed on an upper surface of the semiconductor substrate; and
    a second main electrode disposed on a lower surface of the semiconductor substrate;
    wherein
    (a) the element domain comprises a first portion of a body region of a first conductivity type, a first portion of a drift region of a second conductivity type opposite to the first conductivity type, a gate electrode, and an insulator,
    the first portion of the body region exposed at the upper surface of the semiconductor substrate is a first conductive type region and contacts with the first main electrode,
    the first portion of the drift region disposed on a lower surface of the first portion of the body region,
    the gate electrode is disposed within a gate trench, wherein the gate trench penetrates the first portion of the body region and extends to said first portion of the drift region, and
    the insulator is disposed between the gate electrode and a wall of the gate trench,
    (b) the termination domain comprises at least a second portion of said drift region, and
    the termination domain is provided with at least two termination trenches surrounding the element domain, wherein each of the at least two terminal trenches is extending from the upper surface of the semiconductor substrate to the second portion of said drift region, wherein the at least two terminal trenches are spaced apart from each other by an interval, and
    (c) a floating region of the first conductivity type is provided at a bottom of each of the termination trenches but not provided at a bottom of the gate trench.

2. The semiconductor device as in claim 1, wherein a depth of each of the at least two termination trenches is deeper than a depth of the gate trench.

3. The semiconductor device as in claim 2, wherein the termination domain further comprises a second portion of the body region disposed on an upper surface of the second portion of the drift region.

4. The semiconductor device as in claim 3, wherein the second portion of the body region is not exposed at a side surface of the semiconductor substrate.

5. The semiconductor device as in claim 4, wherein an area of the second portion of the drift region is disposed outside of the second portion of the body region and exposed at the side surface of the semiconductor substrate.

6. The semiconductor device as in claim 5, wherein the insulator is disposed within each of the at least two termination trenches, and
a potential of the second body region on an outer side of the at least two termination trenches is set to a floating state.

7. The semiconductor device as in claim 3, wherein the second portion of the body region is disposed on an entire upper surface of the second portion of the drift region, and is exposed at a side surface of the semiconductor substrate.

8. The semiconductor device as in claim 7, wherein the termination domain is further provided with a further termination trench,
the second further termination trench is disposed around said at least two termination trenches, and the floating region is not provided at a bottom of the second further termination trench.

9. The semiconductor device as in claim 8, wherein a spacing between said further terminal trench and an adjacent one of said at least two termination trenches exceeds the interval.

\* \* \* \* \*

UNITED STATES PATENT AND TRADEMARK OFFICE
CERTIFICATE OF CORRECTION

PATENT NO.        : 9,064,952 B2                                    Page 1 of 1
APPLICATION NO.   : 13/042499
DATED             : June 23, 2015
INVENTOR(S)       : Hidefumi Takaya It is certified that error appears in the above-identified patent and that said Letters Patent is hereby corrected as shown below:

In the Claims
In Column 8, Line 20, Claim 1, delete "terminal" and insert --termination--, therefor.
In Column 8, Line 20 & 21, Claim 1, delete "is extending" and insert --extends--, therefor.
In Column 8, Line 23, Claim 1, delete "terminal" and insert --termination--, therefor.
In Column 8, Line 56, Claim 8, delete "the second further", insert --the further--, therefor.
In Column 8, Line 61, Claim 9, delete "terminal" and insert --termination--, therefor.

Signed and Sealed this
Twenty-eighth Day of June, 2016

Michelle K. Lee
*Director of the United States Patent and Trademark Office*